United States Patent
Verdonk et al.

(10) Patent No.: US 6,821,793 B2
(45) Date of Patent: Nov. 23, 2004

(54) OPTICAL EXCITATION/DETECTION DEVICE AND METHOD FOR MAKING SAME USING DISCRETE PHOTOEMITTER DEVICES

(75) Inventors: Edward Verdonk, San Jose, CA (US); Richard J. Pittaro, San Carlos, CA (US); Shahida Rana, Fremont, CA (US); David Andrew King, Menlo Park, CA (US); Frederick A. Stawitcke, Sunnyvale, CA (US); Richard D. Pering, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/668,435

(22) Filed: Sep. 22, 2003

(65) Prior Publication Data
US 2004/0056262 A1 Mar. 25, 2004

Related U.S. Application Data

(62) Division of application No. 10/153,760, filed on May 22, 2002, now Pat. No. 6,657,235.

(51) Int. Cl.$^7$ .......................... H01L 21/00; H01L 27/15; H01L 31/12; H01L 33/00; H01L 31/113
(52) U.S. Cl. ............................. 438/6; 438/23; 438/24; 438/48; 257/80; 257/291; 257/292; 257/461; 257/462
(58) Field of Search ................... 438/6, 23, 24, 438/48; 257/80, 291, 292, 461, 462

(56) References Cited

U.S. PATENT DOCUMENTS

| | | | | |
|---|---|---|---|---|
| 4,995,049 A | * | 2/1991 | Kahen et al. | 372/50 |
| 5,055,894 A | * | 10/1991 | Chan | 257/85 |
| 5,362,976 A | * | 11/1994 | Suzuki | 257/81 |
| 6,657,235 B1 | * | 12/2003 | Verdonk et al. | 257/80 |

\* cited by examiner

Primary Examiner—Ori Nadav
Assistant Examiner—Samuel A Gebremariam

(57) ABSTRACT

The disclosure is directed toward an optical excitation/detection device that includes an arrayed plurality of photodetectors and discrete photoemitters, as well as a method for making such a device. A CMOS fabricated photodetector array includes an arrayed plurality of photoreceptor areas and photoemitter areas, wherein each photoreceptor area includes a CMOS integrated photoreceptor and each photoemitter area includes at least two buried electric contact pads. The CMOS array is selectively etched back at the locations of the photoemitter areas for regions to reveal the buried contact pads. A plurality of discrete semiconductor photoemitter devices (such as, for example, light emitting diodes) are inserted into, and mechanically retained within, the regions of the CMOS fabricated photodetector array. The inserted discrete semiconductor photoemitter devices make electrical contact with the buried electric contact pads that are revealed within each of the regions to form the optical excitation/detection device from an arrayed plurality of photodetectors and discrete semiconductor photoemitters.

10 Claims, 1 Drawing Sheet

OPTICAL EXCITATION/DETECTION DEVICE AND METHOD FOR MAKING SAME USING DISCRETE PHOTOEMITTER DEVICES

This is a Divisional of application Ser. No. 10/153,760, filed on May 22, 2002, now U.S. Pat. No. 6,657,235, the entire disclosure of which is incorporated herein by reference.

BACKGROUND OF THE INVENTION

1. Technical Field of the Invention

The present invention relates to a device for optical excitation/detection including an arrayed plurality of photodetectors and photoemitters and, in particular, to such a device manufactured using discrete semiconductor photoemitter devices.

2. Description of Related Art

Detector arrays (i.e., devices comprising an arrayed plurality of photodetectors) can be fabricated using well known complementary metal oxide semiconductor (CMOS) fabrication techniques. Such arrays are typically of very high quality, exhibit low noise and are inexpensive to produce. What is lacking with conventional CMOS fabrication techniques for such devices is a way of easily incorporating a plurality of light emitting devices (for example, light emitting diodes (LEDs), laser diodes, or other type photoemitters) into the CMOS array detector device. For example, standard solid state light emitting devices (like LEDs) are difficult to incorporate onto a CMOS detector array because the process for solid state LED photoemitter fabrication is incompatible with the CMOS fabrication process used to form the photodetectors. This, generally speaking, precludes the co-development of CMOS photodetectors and solid state LED photoemitters on the same substrate. It is further recognized that solid state photoemitter light sources are generally edge-emitters. This requires that the semiconductor substrate for the LED (that is generally built by layering-up using planar processes to form the photoemitter) be diced and placed on edge when assembled with the CMOS photodetectors. This manufacturing option is quite difficult to achieve reliably, efficiently and inexpensively using conventional assembly processes.

What is needed is a device for optical excitation/detection, and a method for making such a device, that includes an arrayed plurality of CMOS photodetectors and discrete semiconductor photoemitter devices.

SUMMARY OF THE INVENTION

One embodiment of the present invention comprises an optical excitation/detection device utilizing a CMOS fabricated photodetector array. The CMOS array includes an arrayed plurality of photoreceptor areas and photoemitter areas. Each photoreceptor area includes a CMOS integrated photoreceptor, and each photoemitter area includes at least two buried electric contact pads. A plurality of recessed regions are formed in a top surface of the CMOS array at the locations of the photoemitter areas to reveal the buried electric contact pads. Discrete semiconductor photoemitter devices are then inserted into, and mechanically retained within, the recessed regions of the CMOS fabricated photodetector array. Electrical contact is established between the inserted discrete semiconductor photoemitter devices and the revealed buried electric contact pads to form an optical excitation/detection device that includes an arrayed plurality of CMOS photodetectors and discrete semiconductor photoemitters.

A method for assembling an optical excitation/detection device in accordance with an embodiment of the present invention etches back a top surface of a CMOS fabricated photodetector array that includes an arrayed plurality of photoreceptor areas and photoemitter areas, wherein each photoreceptor area includes a CMOS integrated photoreceptor, and each photoemitter area includes at least two buried electric contact pads. The etch back reveals the buried electric contact pads at each photoemitter area. A discrete semiconductor photoemitter device is then inserted into, and mechanically retained within, each of the recessed regions of the CMOS fabricated photodetector array. Electrical contact is established between the inserted discrete photoemitter devices and the revealed buried electric contact pads to form an optical excitation/detection device that includes an arrayed plurality of photodetectors and discrete semiconductor photoemitters.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE EXEMPLARY EMBODIMENTS OF THE INVENTION

Figure 1:
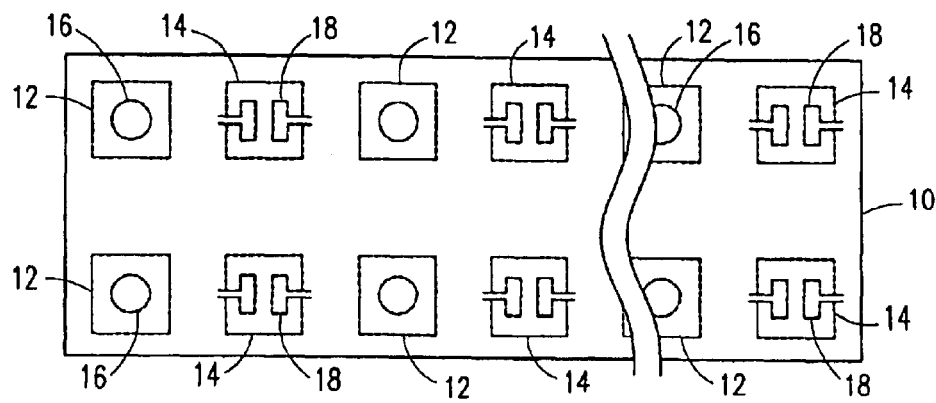
FIG. 1 is a top view of a CMOS fabricated photodetector array.

Reference is now made to FIG. 1 wherein there is shown a top view of a complementary metal oxide semiconductor (CMOS) photodetector array 10. It will be recognized by those skilled in the art that the features illustrated in FIG. 1 are not necessarily drawn to scale and that the size of certain features, dimensions, and the like, may be exaggerated to ease illustration and understanding. The CMOS array 10 is fabricated using conventional complementary metal oxide semiconductor fabrication techniques and includes an arrayed plurality of photoreceptor areas 12 and an arrayed plurality of photoemitter areas 14. Within each photoreceptor area 12, the CMOS fabrication process is used to form an integrated photoreceptor 16 (also referred to as a photodiode). Examples of such photoreceptors 16 include p-i-n diodes, charge coupled devices, avalanche photodiodes, or the like. Associated circuitry (not specifically illustrated) for the photoreceptors 16 (for example, biasing circuits, filters, amplifiers, quadrature detectors, A/D converters, clocks, memory, and the like) is also fabricated using the CMOS techniques on a common substrate with the photoreceptors 16. Within each of the photoemitter areas 14, the CMOS fabrication process is used to form at least two buried electrical contact pads 18. As will be described in more detail herein, it is through these buried electrical contact pads 18 that electrical connections are established between the included circuitry of the CMOS array 10 and subsequently mounted, discrete semiconductor photoemitter devices (see, FIG. 2C) that are attached thereto. Associated circuitry (not specifically illustrated) for the discrete photoemitter devices (for example, current sources, modulation generators, temperature compensators, and the like) is also fabricated using the CMOS techniques on a common substrate with the photoreceptors 16 (and their associated circuitry). Specific detailed description of the CMOS fabrication process used to create the CMOS array 10 (including the arrayed photoreceptors 16, buried electric contact pads 18 and associated circuitry for the photoreceptor areas 12 and photoemitter areas 14) is not provided as these process steps are considered to be well within the capabilities and understanding of one skilled in the art.

Figure 2A:
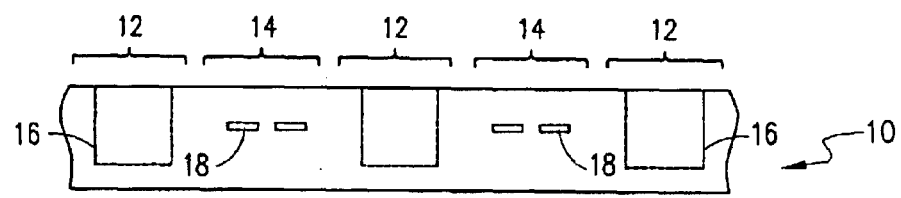
FIGS. 2A–2D are diagrams illustrating a sequence of steps performed in connection with the fabrication of an optical excitation/detection device in accordance with an embodiment of the present invention.
Figure 2B:
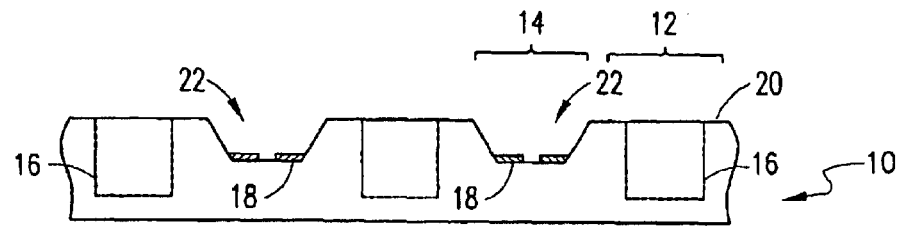

Reference is now made to FIGS. 2A–2D wherein there are shown diagrams illustrating a sequence of steps performed in connection with the fabrication of an optical excitation/detection device in accordance with an embodiment of the present invention. It will be recognized by those skilled in the art that the features illustrated in FIGS. 2A–2D are not necessarily drawn to scale and that the size of certain features, dimensions, and the like, may be exaggerated to ease illustration and understanding. In FIG. 2A, conventional complementary metal oxide semiconductor (CMOS) fabrication techniques are used to form the photodetector array 10 shown in FIG. 1. Next, as shown in FIG. 2B, the semiconductor structure comprising the CMOS array 10 is etched back from a top surface 20 thereof generally at the locations of the photoemitter areas 14 to provide an arrayed plurality of recessed regions (also referred to as trenches, receptors or binding sites) 22. The recessed regions 22 are accordingly formed between the locations of each of the arrayed photoreceptors 16 formed in the photoreceptor areas 12. This etch back further reveals the buried electric contact pads 18 that are designed into the structure of the CMOS array 10 to be made available at the photoemitter areas 14 which coincide with the location of the recessed regions 22. A variety of techniques for etching including wet etching, plasma etching, reactive ion etching, ion milling, and the like, may be used singly or in combination to form the recessed regions 22 in the top surface 20. These recessed regions 22 may have any selected geometric profile (illustrated for exemplary purposes only as a trapezoidal profile or an inverted truncated pyramid shape) provided the regions are sufficiently sized and shaped to allow for reception of a subsequently mounted, discrete semiconductor photoemitter device (see, FIG. 2C). It will, of course, be understood that the future locations of the recessed regions 22 between the photoreceptors 16 must be taken into account in designing and fabricating the CMOS photodetector array 10 (as shown in FIGS. 1 and 2A), especially with respect to the placement of the individual photoreceptors 16 at the photoreceptor areas 12 and any supporting circuitry or interconnections, as well as determining the locations of the buried electric contact pads 18.

Figure 2C:
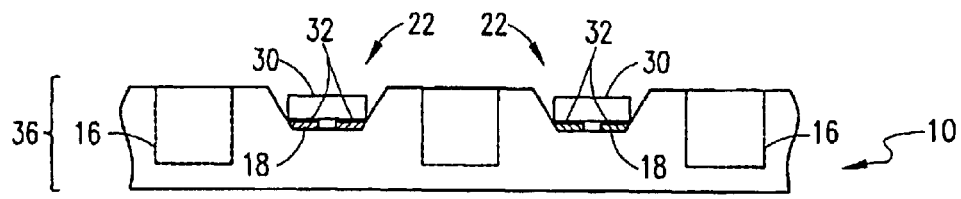

Turning now to FIG. 2C, a discrete semiconductor photoemitter device 30 is inserted into each of the recessed regions 22. In this context, the term "discrete" refers to a semiconductor or solid state device that is either packaged or unpackaged and is fabricated on a substrate separate and apart from the substrate on which the CMOS array 10 is fabricated. Packaged photoemitter devices might further include one or more of the following within the package: optical filters, optical diffusers, optical lenses, and the like. It is also likely, although not necessarily required, that the discrete photoemitter device 30 be fabricated using a semiconductor process other than CMOS. Discrete semiconductor components having light emitting functionality (such as LEDs, laser diodes, and the like) comprise one example of the discrete device 30, and such devices may be obtained from a number of commercial vendors in large quantities with relatively low prices and a wide variety of sizes and shapes. Insertion of these devices 30 into each of the recessed regions 22 of the CMOS array 10 may be accomplished through any suitable manufacturing process including a robotic pick and place process, and the like. The inserted devices 30 are attached to the recessed regions 22 and make electrical contact with the buried electric contact pads using a conductive epoxy 32. The epoxy not only bonds the devices 30 to the array 10, it also may function to absorb light emitted from the devices 30 towards the substrate of the array. Once the mechanical/electrical bond is formed between the devices 30 and CMOS array 10, an excitation/detection device 36 is formed. Alternative attachment/contact mechanisms (for example, soldering, friction fitting, and the like) may be used if desired.

In an alternate embodiment, the recessed regions 22 are not created. The contact pads 18 are positioned at or near the top surface 20. The devices 30 are attached to make electrical contact with the electrical contact pads 18. This alternate configuration produces a slightly thicker array than the previously described device, but requires fewer manufacturing steps.

Figure 2D:
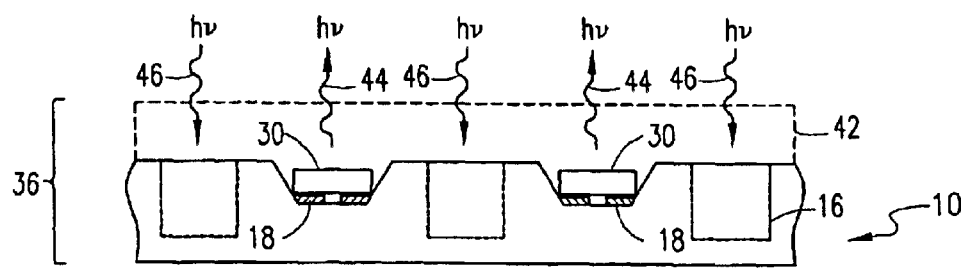

In FIG. 2D, a protective covering (schematically and generally illustrated with reference layer 42) may be formed over the CMOS array 10 and the attached discrete devices 30 comprising the excitation/detection device 36. The cover layer 42 may be comprised of, for example, a polymer, glass, fused quartz or other acceptable transparent or translucent material. *The cover layer 42 necessarily has areas of transparent or translucent material overlying photoemitter devices 30 and photoreceptors 16, but can be opaque between these areas to substantially eliminate the detection of light that propagates from a device 30 to a photodetector 16 without ever exiting the covering layer. This, for example, would reduce the optical cross talk between adjacent sets of photoemitters and photodetectors not intended to function together. In a further embodiment, the transparent/translucent regions of the cover layer 42 can either be clear or have a predetermined color to filter the light. In the resulting device 36, each of the discrete devices 30 includes a light emitting functionality (along with other functionality, such as optical filtering and optical steering, if needed and as desired) and selectively produces an emitted beam of light 44, while the individual photoreceptors 16 operate to receive an incident beam of light 46 and generate a data signal (in either an analog or digital format) having a magnitude that is proportional to measured light intensity. The device 36 accordingly provides for both optical excitation and detection using an arrayed plurality of photodetectors and separately formed photoemitters. Preferably, the photoreceptors also include optical filters incorporated during manufacture. Alternatively, photoreceptor recessed regions (without conductive pads) can be formed in the areas 12 of the array in a manner similar to the photoemitter recessed regions 22 with discrete optical filters inserted therein.

In another embodiment, the devices 30 are attached to the cover layer 42 at predetermined locations and orientations such that they will align with and make contact with the electrical contact pads 18 when the cover layer 42 is placed on top of the array 10.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

We claim:

1. A method for assembling an optical excitation/detection device from a CMOS fabricated photodetector array including an arrayed plurality of photoreceptor areas and photoemitter areas, each photoreceptor area including a CMOS integrated photoreceptor, each photoemitter area including at least two buried electric contact pads, comprising steps of:

etching back a top surface of the CMOS fabricated photodetector array to form recessed regions at the locations of the photoemitter areas in order to reveal the buried electric contact pads; and inserting a plurality of discrete semiconductor photomitter devices into the recessed regions of the CMOS fabricated photodetector array to make electrical contact with the revealed buried electric contact pads therein.

2. The method as in claim 1 wherein the step of inserting comprises the step of performing pick and place assembly to insert the discrete semiconductor photoemitter devices.

3. The method as in claim 1 further including the step of epoxy bonding the discrete semiconductor photoemitter devices within the recessed regions of the CMOS fabricated semiconductor array.

4. The method as in claim 3 wherein the epoxy is conductive to assist in making electrical contact between the discrete semiconductor photoemitter devices and the revealed buried electric contact pads within the recessed regions.

5. The method as in claim 1 further including the step of forming a trasparent or translucent layer over the CMOS fabricated semiconductor array and inserted discrete semiconductor photoemitter devices.

6. The method as in claim 1 wherein the discrete semiconductor photoemitter devices comprise discrete light emitting diodes (LEDs).

7. The method as in claim 1 wherein the discrete semiconductor photoemitter devices comprise discrete laser diodes.

8. A method for assembling an optical excitation/detection device from a CMOS fabricated photodetector array including an arrayed plurality of photoreceptor areas and photoemitter areas, each photoreceptor area including a CMOS integrated photoreceptor, each photoemitter area including at least two buried electric contact pads, comprising steps of:

locating photoemitter areas having electrical contact pads;

inserting a plurality of discrete semiconductor photoemitter devices onto the photoemitter regions of the CMOS fabricated photodetector array to make electrical contact with the electric contact pads.

9. The method of claim 8 further including a step of covering said photoemitter devices with a transparent or translucent layer.

10. The method of claim 8, wherein prior to step of inserting, a step of placing photoemitter devices in predetermined transparent or translucent portions of a covering layer is performed.

* * * * *